(12) United States Patent
Kitada et al.

(10) Patent No.: US 8,906,208 B2
(45) Date of Patent: Dec. 9, 2014

(54) SPUTTERING APPARATUS, SPUTTERING METHOD, AND ELECTRONIC DEVICE MANUFACTURING METHOD

(75) Inventors: Toru Kitada, Burnsville, MN (US); Naoki Watanabe, Kawasaki (JP); Motonobu Nagai, Machida (JP)

(73) Assignee: Canon Anelva Corporation, Kawasaki-shi (JP)

( * ) Notice: Subject to any disclaimer, the term of this patent is extended or adjusted under 35 U.S.C. 154(b) by 867 days.

(21) Appl. No.: 13/104,472

(22) Filed: May 10, 2011

(65) Prior Publication Data

US 2011/0209986 A1 Sep. 1, 2011

Related U.S. Application Data

(63) Continuation of application No. PCT/JP2009/007278, filed on Dec. 25, 2009.

(51) Int. Cl.
| | |
|---|---|
| *C23C 14/35* | (2006.01) |
| *H01F 41/18* | (2006.01) |
| *B82Y 25/00* | (2011.01) |
| *C23C 14/34* | (2006.01) |
| *C23C 14/54* | (2006.01) |
| *H01J 37/34* | (2006.01) |
| *H01F 10/32* | (2006.01) |
| *H01L 43/12* | (2006.01) |

(52) U.S. Cl.
CPC ............... *H01F 41/18* (2013.01); *B82Y 25/00* (2013.01); *C23C 14/34* (2013.01); *C23C 14/3464* (2013.01); *C23C 14/54* (2013.01); *H01J 37/3417* (2013.01); *H01J 37/3447* (2013.01); *H01J 37/3452* (2013.01); *H01J 37/3455* (2013.01); *H01J 37/3476* (2013.01); *H01F 10/3254* (2013.01); *H01L 43/12* (2013.01)

USPC ............. 204/192.13; 204/192.2; 204/298.03; 204/298.16; 204/298.18; 204/298.28

(58) Field of Classification Search
CPC .............. C23C 14/225; C23C 14/3464; C23C 14/3492; C23C 14/351; C23C 14/352; C23C 14/505; C23C 14/54; C23C 14/542; H01J 37/3417; H01J 37/3447; H01J 37/3452; H01J 37/3455; H01J 37/3476; H01J 37/3402; H01J 34/345; H01J 37/3464
USPC ............... 204/192.13, 192.2, 298.03, 298.16, 204/298.28, 298.18
See application file for complete search history.

(56) References Cited

U.S. PATENT DOCUMENTS

| | | | |
|---|---|---|---|
| 4,607,903 | A | 8/1986 | Hoshino et al. |
| 6,290,824 | B1 | 9/2001 | Ishikawa et al. |

(Continued)

FOREIGN PATENT DOCUMENTS

| | | |
|---|---|---|
| JP | 60-207270 A | 10/1985 |
| JP | 61-250163 A | 11/1986 |

(Continued)

OTHER PUBLICATIONS

Machine Translation of JP 2008-294416 publication date Dec. 4, 2008.*

(Continued)

*Primary Examiner* — Rodney McDonald
(74) *Attorney, Agent, or Firm* — Fitzpatrick, Cella, Harper & Scinto

(57) ABSTRACT

A sputtering apparatus includes a substrate holder which holds a substrate to be rotatable in the plane direction of the processing surface of the substrate, a substrate-side magnet which is arranged around the substrate and forms a magnetic field on the processing surface of the substrate, a cathode which is arranged diagonally above the substrate and receives discharge power, a position detection unit which detects the rotational position of the substrate, and a controller which controls the discharge power in accordance with the rotational position detected by the position detection unit.

15 Claims, 12 Drawing Sheets

(56) References Cited

U.S. PATENT DOCUMENTS

| | | |
|---|---|---|
| 2001/0050224 A1 | 12/2001 | Ishikawa et al. |
| 2002/0017910 A1 | 2/2002 | Sakai |
| 2002/0064595 A1 | 5/2002 | Nomura et al. |
| 2005/0103620 A1 | 5/2005 | Chistyakov |
| 2005/0199490 A1* | 9/2005 | Nomura et al. .......... 204/298.11 |
| 2008/0210549 A1 | 9/2008 | Zuger |
| 2011/0042209 A1 | 2/2011 | Yamaguchi et al. |
| 2011/0223346 A1 | 9/2011 | Kitada et al. |

FOREIGN PATENT DOCUMENTS

| | | |
|---|---|---|
| JP | 6-207270 A | 7/1994 |
| JP | 9-069460 A | 3/1997 |
| JP | 2000-265263 A | 9/2000 |
| JP | 2002-069631 A | 3/2002 |
| JP | 2002-167661 A | 6/2002 |
| JP | 2008-294416 * | 12/2008 |
| WO | 2010/038421 A1 | 4/2010 |

OTHER PUBLICATIONS

Office Action issued in Chinese Application No. 200980147190.7, dated Dec. 3, 2012 (6 pages).

Supplementary European Search Report issued in European Patent Application No. 09834517.6, dated Dec. 5, 2013 (8 pages).

* cited by examiner

F I G. 5
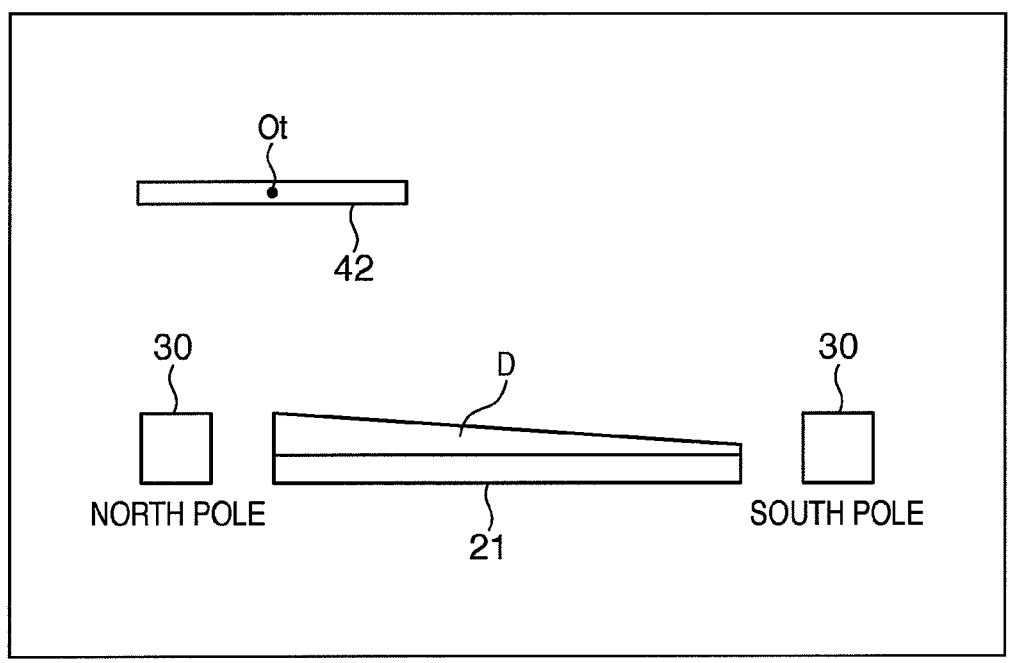

EMBODIMENT

1σ = 0.5%

COMPARATIVE EXAMPLE

1σ = 3.1%

| TYPE OF TARGET MATERIAL | TYPE OF CONTROL PATTERN |
|---|---|
| TARGET MATERIAL 1 | CONTROL PATTERN 1 |
| TARGET MATERIAL 2,3 | CONTROL PATTERN 2 |
| ... | ... |

| TYPE OF TARGET MATERIAL | COMBINATION OF CATHODE POSITIONS | SET VALUES OF A, B, AND α |
|---|---|---|
| TARGET MATERIAL 1 | - | A1, B1, α1 |
| ARGET MATERIAL 1 | 72° | A1, B1, α2 |
| ARGET MATERIAL 1 | 72°, 144° | A2, B2, α3 |
| ... | ... | ... |
| ARGET MATERIAL 2 | - | A4, B4, α4 |

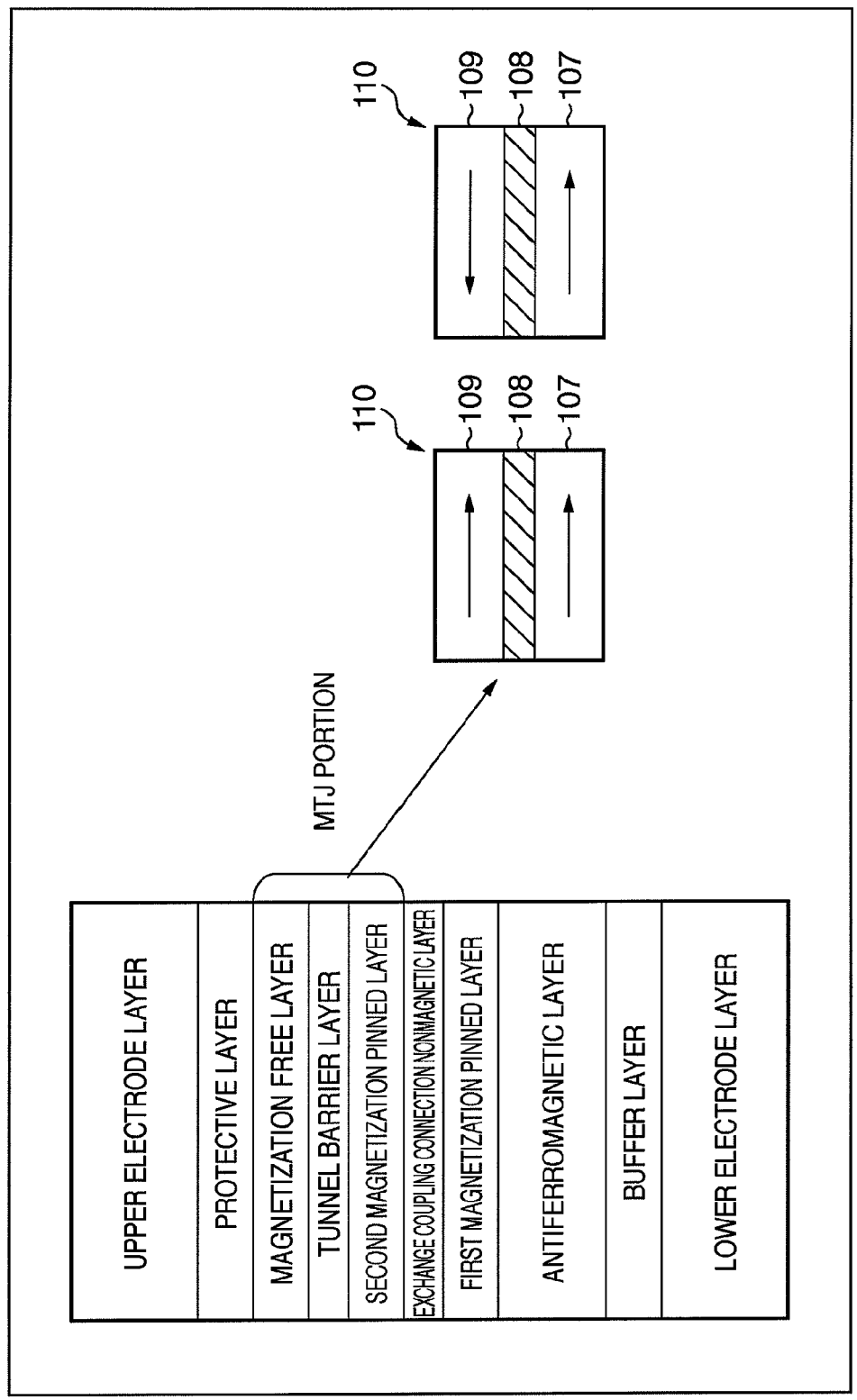

SPUTTERING APPARATUS, SPUTTERING METHOD, AND ELECTRONIC DEVICE MANUFACTURING METHOD

CROSS-REFERENCE TO RELATED APPLICATIONS

This application is a continuation of International Application No. PCT/JP2009/007278, filed on Dec. 25, 2009, which claims the benefit of Japanese Patent Application No. 2008-333480, filed Dec. 26, 2008, and Japanese Patent Application No. 2008-333066, filed on Dec. 26, 2008. The contents of the aforementioned applications are incorporated herein by reference in their entirety.

TECHNICAL FIELD

The present invention relates to a sputtering apparatus and sputtering method for depositing a film on a substrate by applying a high voltage to a cathode to generate a discharge between the cathode and a substrate holder, and sputtering a target attached to the cathode, and an electronic device manufacturing method. More specifically, the present invention relates to a sputtering apparatus and sputtering method for depositing a film while rotating a substrate along its processing surface, and an electronic device manufacturing method.

BACKGROUND ART

There has conventionally been known a sputtering apparatus which deposits a film on a substrate. More specifically, a cathode which supports a target is arranged offset diagonally above the substrate. While rotating the substrate along its processing surface, the target material is sputtered by oblique incidence sputtering.

As a technique pertaining to this, a sputtering method and apparatus have been proposed in which a substrate is rotated at an appropriate speed and the angle θ of the central axis of a target with respect to the normal of the substrate is maintained at $15°≤θ≤45°$ (see PLT1). This sputtering apparatus can generate a film with a uniform thickness and quality even if the target diameter is less than or equal to the substrate diameter.

CITATION LIST

Patent Literature

PLT1: Japanese Patent Laid-Open No. 2000-265263

SUMMARY OF INVENTION

Technical Problem

Even when a conventional oblique incidence sputtering technique is used to deposit a magnetic film, the sheet resistance distribution becomes nonuniform, compared to film deposition using another material. However, no serious problem occurs because the in-plane distribution (1σ) is less than 1%.

Recently, with an increase in demand for higher sputtering rates, attempts have been made to increase discharge power. When a magnetic film was deposited by oblique incidence sputtering using high power, the sheet resistance distribution became greatly nonuniform. When a plurality of targets is co-sputtered using a plurality of cathodes, the nonuniformity of the film deposition distribution leads to the nonuniformity of the distribution of each target material.

The present invention has been made to solve the above problems, and has as its object to provide a sputtering technique capable of depositing a film having a uniform in-plane distribution and easily manufacturing a high-performance electronic device.

Solution to Problem

To solve the above problems, a sputtering apparatus according to the present invention comprises a substrate holder which holds a substrate to be able to rotate the substrate in a plane direction of a processing surface of the substrate, substrate magnetic field forming means, arranged around the substrate, for forming a magnetic field on the processing surface of the substrate, a cathode which is arranged at a position diagonally opposing the substrate and which receives discharge power, position detection means for detecting a rotational position of the substrate, and power control means for controlling power applied to the cathode in accordance with the rotational position detected by the position detection means.

A sputtering method according to the present invention comprises executing film deposition by applying, to a cathode arranged at a position diagonally opposing a substrate, power adjusted in accordance with a rotational position of the substrate that is detected by position detection means, while rotating the substrate in a plane direction of a processing surface of the substrate and forming a magnetic field on the processing surface.

An electronic device manufacturing method according to the present invention comprises a film deposition step of depositing a film by a sputtering method by applying, to a cathode arranged at a position diagonally opposing a substrate, power adjusted in accordance with a rotational position of the substrate that is detected by position detection means, while rotating the substrate in a plane direction of a processing surface of the substrate and forming a magnetic field on the processing surface.

Advantageous Effects of Invention

The present invention can deposit a film having uniform in-plane distributions of the film thickness and composition, and manufacture a high-performance electronic device.

BRIEF DESCRIPTION OF DRAWINGS

The accompanying drawings, which are incorporated in and constitute a part of the specification, illustrate embodiments of the invention and, together with the description, serve to explain the principles of the invention.

FIG. 5 is a view showing a sputtering apparatus of a comparative example which deposits a magnetic material by applying constant discharge power;

FIG. 17 is an explanatory view showing a TMR element as an example of an electronic component which can be manufactured by applying the sputtering method of the present invention.

DESCRIPTION OF EMBODIMENTS

Embodiments of the present invention will be described below with reference to the accompanying drawings. However, the present invention is not limited to the following embodiments.

[First Embodiment]

Figure 1:
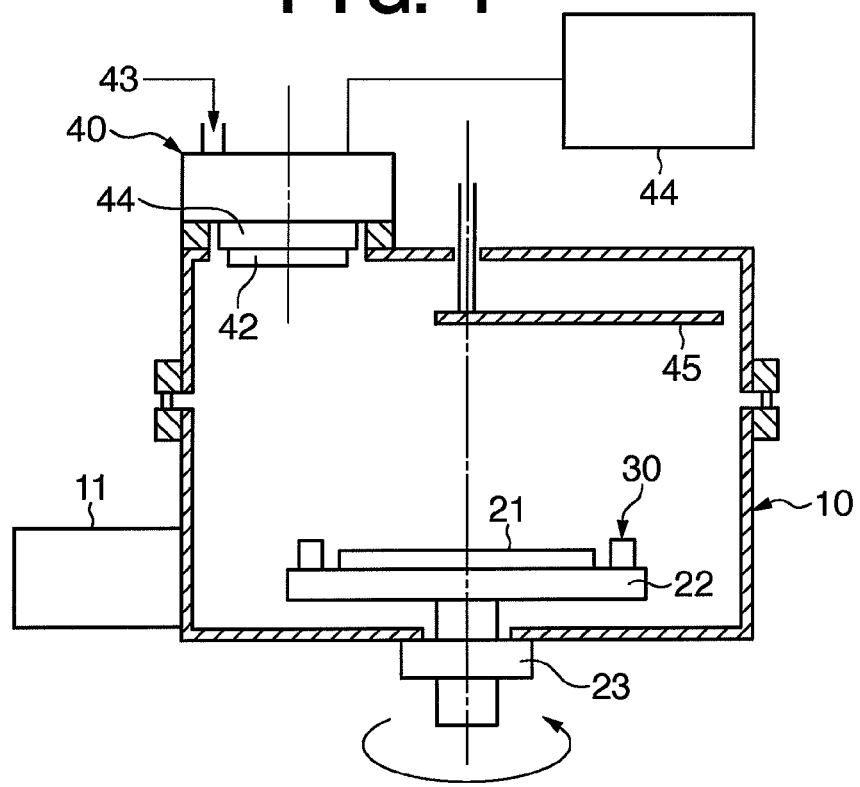
FIG. 1 is a schematic sectional view schematically showing a sputtering apparatus according to the first embodiment.

As shown in FIG. 1, a sputtering apparatus according to the first embodiment includes a chamber (reaction vessel) 10 which partitions and forms a processing space. As an exhaust system capable of evacuating the interior of the chamber 10 to a desired degree of vacuum, a vacuum pump 11 is connected to the chamber 10 via a main valve (not shown) such as a gate valve.

A disk-like substrate holder 22 which supports a disk-like substrate 21 on its upper surface is arranged at the bottom of the processing space in the chamber 10. In general, the substrate 21 to be processed is carried onto the substrate holder 22 by a handling robot (not shown) via a horizontal slot (not shown). The substrate holder 22 is a disk-like table (stage) and, for example, electrostatically chucks and supports the substrate 21 on its upper surface. The substrate holder 22 is formed from a conductive member, and also functions as an electrode which generates a discharge between the substrate holder 22 and a cathode 41 (to be described later).

The substrate holder 22 is connected to a rotational driving mechanism (not shown) and can rotate about its central axis. Along the processing surface of the substrate 21, the substrate holder 22 rotates the substrate 21 chucked and supported on the support surface. The rotating unit or rotational driving mechanism of the substrate holder 22 includes a position detection unit (position sensor) 23 which detects the rotational position of the substrate 21 (rotational position of the substrate holder 22, or that of a magnetic field M formed by a substrate-side magnet 30 (to be described later)). The position detection unit 23 is, for example, a rotary encoder.

Figure 2:
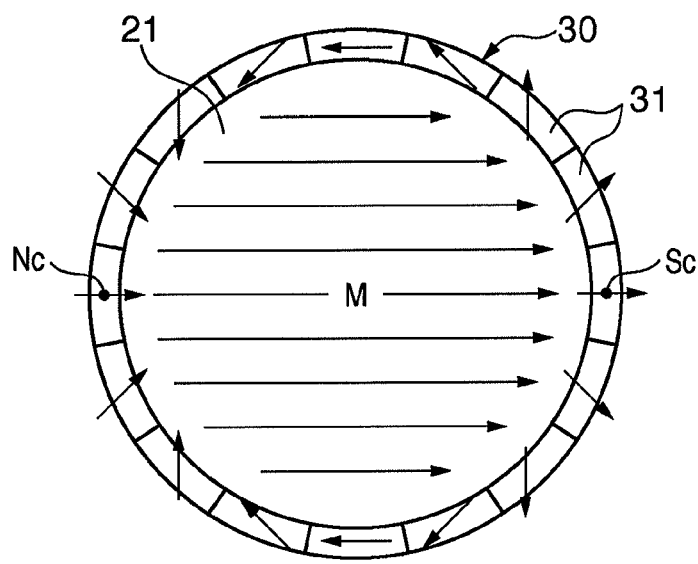
FIG. 2 is a plan view schematically showing an example of a magnetic field formed by a substrate-side magnet.

The outer diameter of the disk-like substrate holder 22 is set larger than that of the substrate 21. A substrate magnetic field forming portion is arranged around the substrate 21 on the substrate holder 22 to form a magnetic field on the processing surface of the substrate 21. The substrate magnetic field forming portion is formed from, for example, a substrate-side magnet 30. As shown in FIG. 2, the substrate-side magnet 30 is obtained by arranging a plurality of magnet pieces 31 of a permanent magnet at equal intervals at the periphery of the support surface of the substrate holder 22 in the circumferential direction of the substrate holder 22. The substrate-side magnet 30 can rotate together with the substrate 21 on the support surface of the substrate holder 22.

As shown in FIG. 2, the substrate-side magnet 30 forms, along the processing surface of the substrate 21, a uniform magnetic field having a directional property in which it faces in one direction on the processing surface. In the example of FIG. 2, a dipole ring is used, and a plurality of arcuated magnet pieces 31 magnetized in different directions are combined into an annular shape so as to form the magnetic field M in one direction. However, the structure of the substrate-side magnet 30 is not limited to this, and may be an integrally molded magnet. Alternatively, the substrate-side magnet 30 may be arranged separately from the substrate holder 22 so that it can rotate in synchronism with the rotation of the substrate 21. The substrate-side magnet 30 is not limited to a permanent magnet, and may be an electromagnet.

As shown in FIG. 1, the substrate 21 is horizontally held on the support surface of the substrate holder 22. The substrate 21 is, for example, a disk-like silicon wafer ($SiO_2$ substrate), but is not limited to this.

A cathode unit 40 including the cathode 41 which holds a target 42 is arranged diagonally above the substrate holder 22 in the processing space. The cathode unit 40 is arranged offset so that the center position of the cathode 41 shifts from the central axis of the substrate 21 in the plane direction of the substrate 21 and the cathode 41 is disposed at a position diagonally opposing the substrate 21.

A magnetron including a plurality of permanent magnets (cathode-side magnets) is arranged on the second (face-up) surface side of the cathode 41 in the cathode unit 40 to form a magnetic field on the surface side of the target 42 attached to the first (face-down) surface of the cathode 41. As the magnetron, for example, a magnet assembly in which permanent magnets are arranged two-dimensionally may be arranged on the second surface side of the cathode 41 to form a cusped magnetic field on the surface side of the target 42.

The plate-like target 42 is attached to the first surface of the cathode 41 of the cathode unit 40. More specifically, the target 42 is arranged on the processing space side opposite to the cathode 41, and faces down. The material of the target 42 changes depending on the type of film to be deposited on the substrate 21.

The cathode unit 40 is electrically connected to a discharge power supply 44 which applies a discharge voltage to the cathode 41. The discharge power is an arbitrary one of high-frequency power, DC power, and superposition of high-frequency power and DC power.

A discharge gas introduction system 43 is connected to the casing of the cathode unit 40 to supply a discharge process gas (discharge gas) to the vicinity of the cathode 41. The discharge gas is an inert gas such as Ar gas. The cathode 41 generates a plasma discharge between the cathode 41 and the substrate holder 22 so as to be able to sputter the target 42 attached to the cathode unit 40.

A shutter 45 is arranged in front of the cathode unit 40 to open and close the space between the cathode unit 40 and the substrate 21. The shutter 45 allows pre-sputtering to remove a deposit on the surface of the target 42 before actual sputtering.

Figure 3:
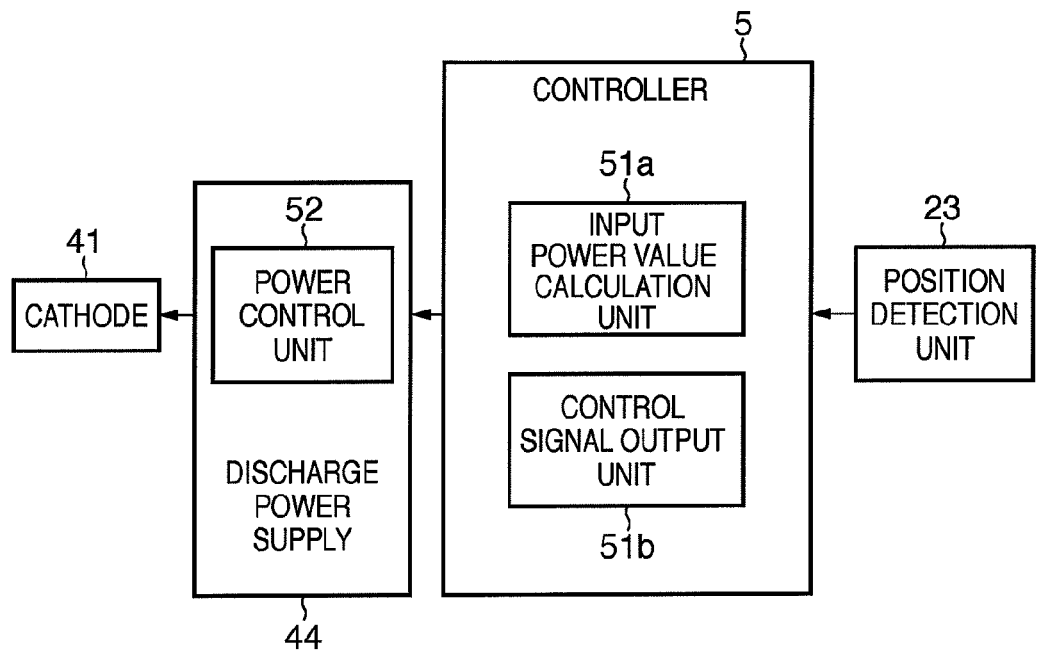
FIG. 3 is a block diagram showing the arrangements of a cathode unit and controller according to the first embodiment.

A controller 5 which is arranged in the sputtering apparatus according to the embodiment and controls the above-described building components will now be explained with reference to FIG. 3. FIG. 3 is a block diagram showing the controller 5 according to the embodiment.

As shown in FIG. 3, the controller 5 in the embodiment includes, for example, a general computer and various drivers. The controller 5 executes a film deposition processing operation in accordance with a predetermined program or an instruction from a host apparatus. More specifically, the controller 5 outputs instructions to the discharge power supply 44, the driving unit of the shutter 45, the discharge gas introduction system 43, the vacuum pump 11, the rotational driving mechanism of the substrate holder 22, and the like shown in FIG. 1. In accordance with these instructions, a variety of process conditions are controlled, including the discharge time, discharge power, selection of the target 42, and process pressure. The controller 5 can also acquire the output values of sensors such as a pressure gauge (not shown) for measuring the internal pressure of the chamber 10, and the position detection unit 23 for detecting the rotational position of the substrate 21. The controller 5 can perform control complying with the apparatus state.

As shown in FIGS. 1 and 3, the controller 5 includes an input power value calculation unit 51a and control signal output unit 51b. The input power value calculation unit 51a calculates input power to the cathode 41 to increase/decrease the film deposition amount in accordance with a rotational position detected by the position detection unit 23. The control signal output unit 51b outputs a control signal (e.g., voltage or current corresponding to a power value having a calculated magnitude) to adjust the power value to the calculated one. The controller 5 has a function of outputting a signal for controlling power applied to the cathode 41 in accordance with the rotational position of the substrate 21, based on the positional relationship between the rotational position of the substrate 21 and the cathode 41 during discharge.

Figure 4:
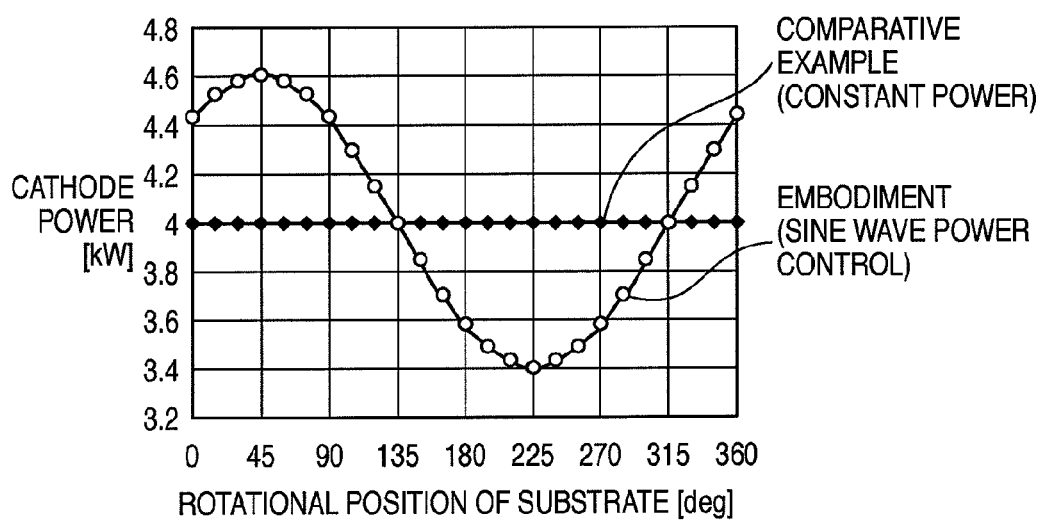
FIG. 4 is a graph exemplifying a discharge power sine wave control map according to the embodiment.

A power control unit 52 shown in FIG. 3 increases/decreases power from the discharge power supply 44 based on a control signal input from the control signal output unit 51b, and outputs, to the cathode 41, power having a magnitude calculated by the input power value calculation unit 51a. The cathode 41 receives discharge power corresponding to the rotational position of the substrate 21. The input power value is given by, for example, a sine wave function with respect to the rotational position of the substrate 21, as shown in FIG. 4. The input power value calculation unit 51a can calculate an input power value by defining in advance, as a map as shown in FIG. 4, the correspondence between the rotational position of the substrate 21 and input power to the cathode 41. The rotational position of the substrate 21 can be determined using, as a reference, a line segment which is parallel to the direction of the magnetic field M shown in FIG. 2 and passes through the center of the substrate 21.

A sputtering method executed using the sputtering apparatus will be described together with the operation of the sputtering apparatus shown in FIGS. 1 to 3.

In the sputtering method using the sputtering apparatus according to the present invention, first, the substrate (wafer) 21 to be processed is set on the substrate holder 22. The substrate 21 is carried onto the substrate holder 22 using a handling robot (not shown) via a horizontal slot (not shown).

Then, the vacuum pump 11 evacuates the interior of the chamber 10 to a predetermined degree of vacuum. The discharge gas introduction system 43 introduces a discharge gas such as Ar gas into the chamber 10.

In this state, a magnetic field is formed on the surface of the target 42 of the cathode unit 40, and discharge power is supplied, thereby generating a plasma discharge between the target 42 and the substrate holder 22. Examples of the target 42 are magnetic material-containing targets such as a Co-containing target, Fe-containing target, and Ni-containing target. Examples of co-sputtering are those using targets made of various different magnetic materials, especially ferromagnetic materials, such as co-sputtering of Co- and Fe-containing targets to deposit a CoFe layer, and co-sputtering of Fe- and Ni-containing targets to deposit an NiFe layer. As a matter of course, a target made of a magnetic material containing a diamagnetic material such as B, C, or P is also available.

In film deposition, a magnetic field having a directional property in which it faces in one direction is formed on the processing surface of the substrate 21. In addition, the substrate 21 is rotated along its processing surface. When, for example, the rotational speed is stabilized during discharge of the cathode unit 40, the position detection unit 23 detects the rotational position of the substrate 21. Input power to the cathode 41 is adjusted in accordance with the rotational position detected by the position detection unit 23.

Figure 6A:
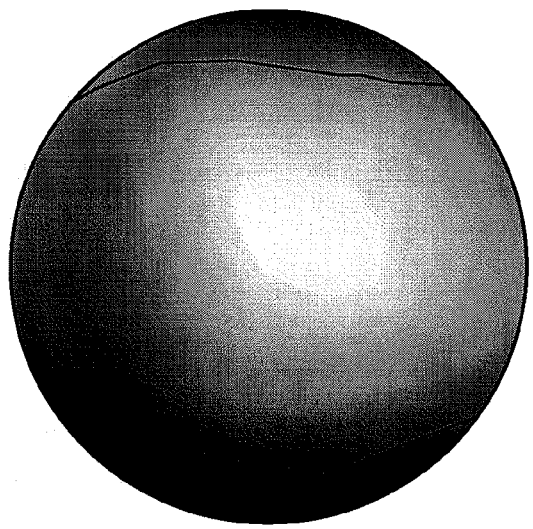
FIG. 6A is a view exemplifying a sheet resistance distribution (film thickness distribution) on a substrate according to the embodiment.
Figure 6B:
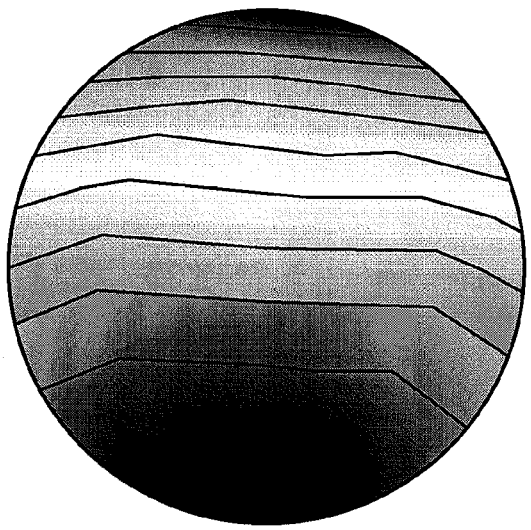
FIG. 6B is a view exemplifying a sheet resistance distribution (film thickness distribution) on a substrate in a comparative example.

Control of input power will now be described in more detail. FIG. 4 is a graph showing an input power control map in the sputtering method using the sputtering apparatus according to the present invention. FIGS. 5, 6A and 6B are views for explaining the principle of the embodiment.

The sputtering method using the sputtering apparatus according to the present invention controls input power so that the input power P to the cathode 41 forms a sine wave with respect to the rotational position (angle of rotation) θ of the substrate 21, as shown in FIG. 4 and equation (1):

$$P = A \cdot \sin(\theta + \alpha) + B \tag{1}$$

$$A = a \cdot B \tag{2}$$

Based on equation (1), the controller 5 calculates discharge power to be applied to the cathode 41 as a sine wave function with respect to the rotational position of the substrate 21. Note that θ is $0° \leq \theta \leq 360°$. A is the amplitude of input power, α is the phase angle, B is the center value of the amplitude of input power, and a is the regulation of input power.

In equation (1), the amplitude A can be arbitrarily set as long as uniform film deposition can be implemented. For example, the amplitude A can be determined in accordance with the center value B, as represented by equation (2). In this case, the regulation a preferably takes a value of 0.1 to 0.4. If the regulation a is excessively small, the effects of the present invention are not well obtained. If the regulation a is excessively large, it exceeds a level at which nonuniformity is canceled when speed is not changed, impairing the uniformity all the more.

FIG. 5 shows a comparative example in which a film of a magnetic material (e.g., NiFe) is deposited by applying constant discharge power regardless of the rotational position of the substrate 21, unlike the present invention. In this comparative example, the film becomes thick at a specific portion highly correlated to the formation state of a magnetic field on the processing surface of the substrate 21. More specifically, the film D gradually becomes thinner from the north pole to south pole of the substrate-side magnet 30. In this graded distribution, the film thickness difference becomes large near the centers Nc and Sc (see FIG. 2) of magnetic poles between the north and south poles in the circumferential direction. In FIG. 5, Ot is the center of the target 42.

When no substrate-side magnet 30 is arranged, the scattering amount of sputtered particles becomes large at a position near the target 42 and small at a position apart from the target 42. Even when the substrate-side magnet 30 is arranged, this basic distribution remains unchanged. However, it can be considered that a portion which readily attracts sputtered particles (portion where the scattering amount of sputtered particles is large), and one which rarely attracts them are formed on the processing surface due to the formation state of a magnetic field on the processing surface of the substrate 21.

From this, the controller 5 controls input power to the first power value in accordance with the slanted distribution shape when the first portion where the scattering amount of sputtered particles is large due to the formation state of a magnetic field on the substrate 21 is positioned near the cathode 41 during discharge. Further, an input power control unit 52 controls input power to the second power value larger than the first power value when the second portion where the scattering amount of sputtered particles is smaller than that at the first portion is positioned near the cathode 41 during discharge.

More specifically, when a portion (near the center Nc of the north pole in the circumferential direction in the above-described example) where the film becomes thick faces the target 42 of the cathode unit 40 during discharge, the controller 5 decreases input power of the substrate 21, thereby decreasing the sputtering yield and the film deposition amount at the portion where the scattering amount is large. When a portion (near the center Sc of the south pole in the circumferential direction in the above-described example) where the film becomes thin faces the target, the controller 5 increases the input power, thereby increasing the sputtering yield and the film deposition amount. As a result, the nonuniformity of the distribution can be canceled.

Along with rotation, a given point of the substrate holder 22 which rotates at a constant speed moves between a position closest to the cathode 41 and one most distant from the cathode 41. The power value is controlled to form a sine wave corresponding to a change of the positional relationship between the rotational position of the substrate 21 and the cathode 41 during discharge. This control is preferable because it can stably maintain plasma conditions.

Note that portions serving as the first and second portions change depending on, for example, the positional relationship between the cathode 41 and the substrate holder 22, the rotational speed of the substrate holder 22, and when magnetron sputtering is performed, the structure of a magnet arranged on the side of the cathode 41. For this reason, the first and second portions are obtained in advance by an experiment or the like, and input power is controlled in accordance with them. In the experiment for obtaining the first and second portions, a film is deposited while keeping input power constant, and the thickness distribution of the deposited film is measured.

FIGS. 6A and 6B are explanatory views each showing a sheet resistance distribution (film thickness distribution) on the substrate 21. FIG. 6A shows a sheet resistance distribution (embodiment) on the substrate 21 when sine wave control of input power is done. FIG. 6B shows a sheet resistance distribution (comparative example) when input power is kept constant during film deposition.

As film deposition conditions in the embodiment, the target material is NiFe, the film deposition pressure is 0.05 Pa, the rotational speed of the substrate 21 is 60 rpm, the regulation a of the amplitude A of input power is 14%, and the center value B of the amplitude of input power is 4 kW. In the comparative example, input power is kept constant at 4 kW, and the remaining conditions are the same as those in the embodiment.

As shown in FIGS. 6A and 6B, the in-plane distribution ($1\sigma$) was 0.5% in the embodiment and 3.1% in the comparative example. It was confirmed that the uniformity of the in-plane distribution in the embodiment is very high. In FIG. 6B, the magnetic field direction is a direction almost perpendicular to contours. The sheet resistance is low on the north pole side (i.e., the film thickness is large), and high on the south pole side (i.e., the film thickness is small). Note that the contours indicate normalized sheet resistance values, and the interval between them is 0.01.

The normalized sheet resistance value Rn is given by $$Rn = Rs/Rs, \max \quad (3)$$

where Rs is the sheet resistance value, and Rs,max is the maximum value of the sheet resistance value.

The input power control in the embodiment is not limited to sine wave control, and input power may be switched in two or more steps. Alternatively, input power may be gradually decreased to the first power as the first portion comes close to the cathode, and gradually increased to the second power as the second portion comes close to the cathode. The linear and quadratic functions of the rotational position or the like may be composited. Although the same sine wave control may be performed throughout film deposition, the input power control method may be changed between, for example, the initial, middle, and late stages of film deposition. In addition to the first and second portions, the third portion may be obtained to set an input power different from those for the first and second portions.

Note that the rotational position of the substrate is not limited to a specific position, and includes a ranging rotational section (rotational position range) of the substrate. For example, the magnitude of average power applied in the rotational section of the substrate may be controlled in accordance with the rotational section of the substrate.

For example, DC power having a predetermined magnitude or high-frequency power having a predetermined frequency may be intermittently applied to increase/decrease the input duration or interval in accordance with the rotational section of the substrate.

[Second Embodiment]

Figures 7, 8:
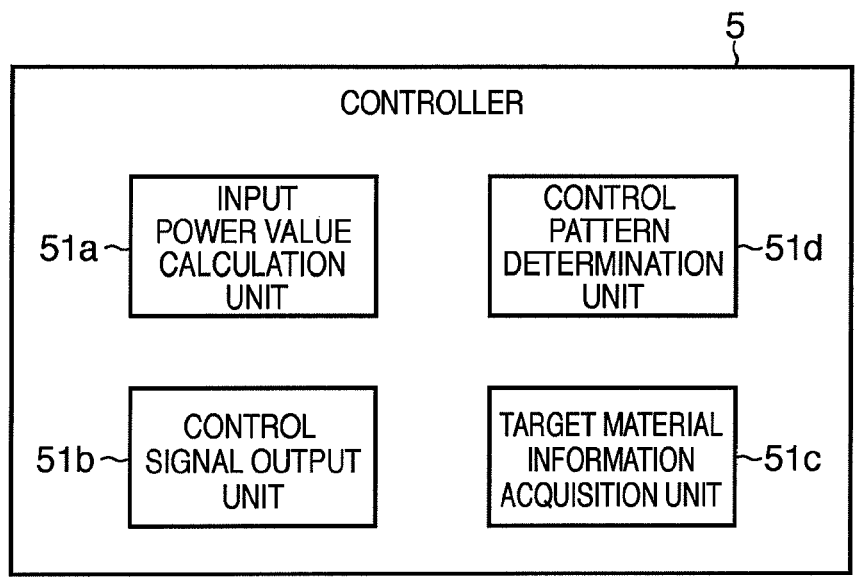
FIG. 7 is a block diagram showing the arrangement of a controller according to the second embodiment.
FIG. 8 is a table exemplifying a table which defines the correspondence between the target material and the control pattern.
Figure 9:
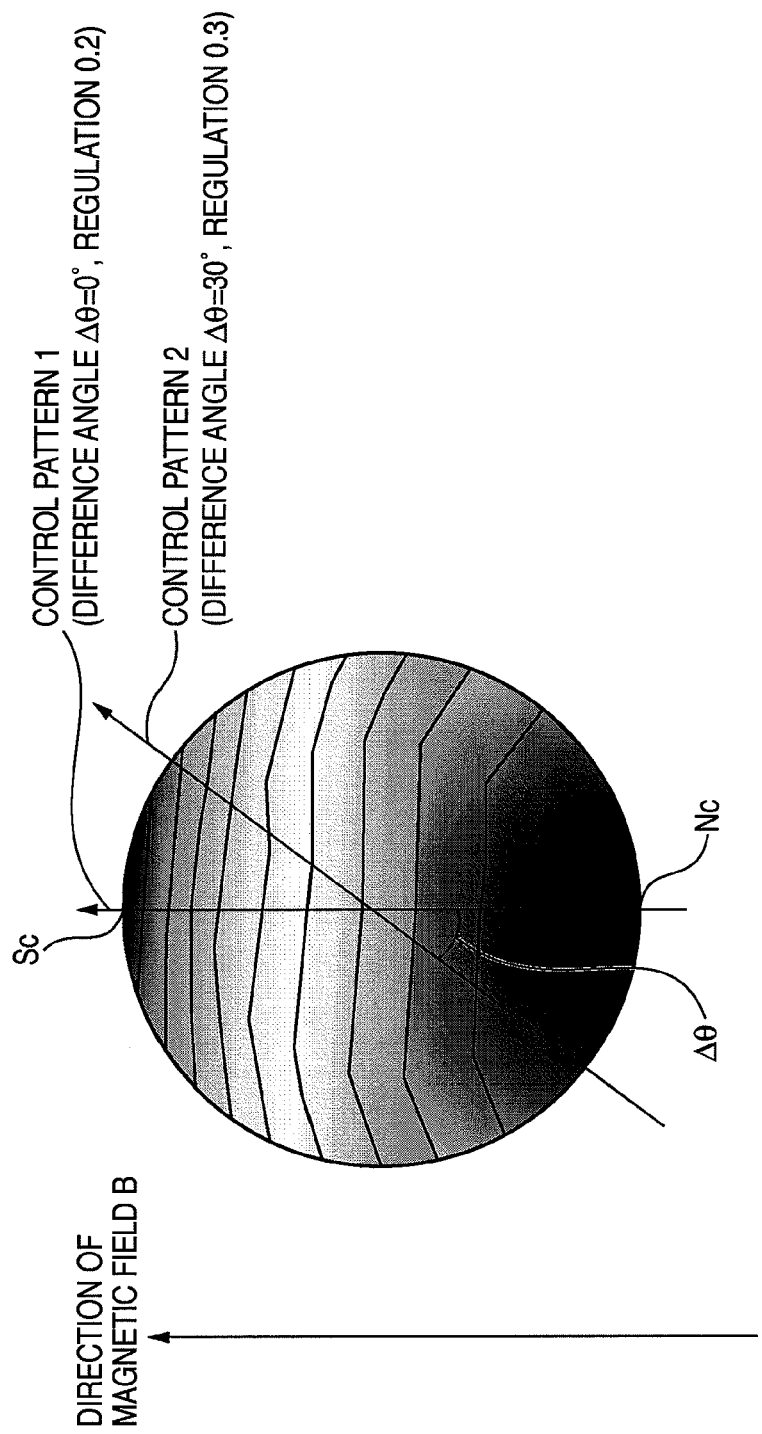
FIG. 9 is a view for explaining the control pattern in FIG. 8.

The control pattern may be changed in accordance with the target material, as shown in FIGS. 7 to 9. This is because the trend of nonuniformity of the film thickness distribution changes depending on the target material.

FIG. 7 is a block diagram showing only a controller 5. The remaining arrangement is the same as that in FIG. 3 in the first embodiment. A target material information acquisition unit 51c acquires information of a target material selected in film deposition as a user input, data stored in advance, or the like. A control pattern determination unit 51d holds a table as shown in FIG. 8, and determines a control pattern based on target material information acquired by the target material information acquisition unit 51c.

FIG. 9 exemplifies a control pattern. FIG. 9 shows the film thickness distribution of a film deposited without using the method of the present invention. In the example shown in FIG. 9, the direction in which the film thickness increases matches the magnetic field direction. In this case, the difference angle $\Delta\theta = 0$, and a corresponding value of the phase $\alpha$ is set. A position of the center Nc of the north pole in the circumferential direction with respect to the target position is defined as the rotational position $\theta$ of the substrate. To maximize the rotational speed when the center Nc of the north pole in the circumferential direction comes to the target position ($\theta=0°$), the phase $\alpha$ is set to 90°, though it depends on a reference position.

However, the magnetic field direction and the direction in which the film thickness increases differ from each other depending on the film deposition material. This difference is clarified in advance as the difference angle $\Delta\theta$ by an experiment or the like, and a corresponding phase $\alpha$ is set. The film thickness distribution can be appropriately controlled according to the film type. For example, to maximize the rotational speed when a portion having the largest film thickness comes to the target position, the phase $\alpha$ is set to, for example, 120° (or 60° in accordance with the direction of the difference angle) for the difference angle $\Delta\theta=30°$.

Similarly, the regulation a and the like can be set to proper values in accordance with the target material.

[Third Embodiment]

Figures 10, 11:
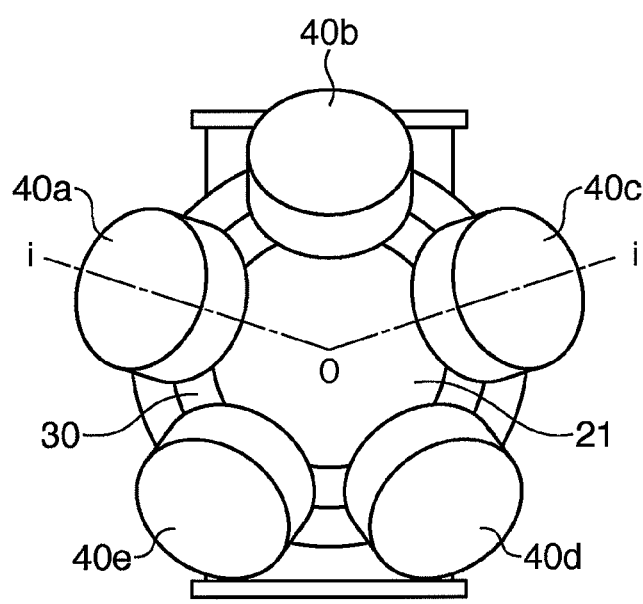
FIG. 10 is a schematic sectional view schematically showing a sputtering apparatus according to the third embodiment.
FIG. 11 is a plan view schematically showing the sputtering apparatus according to the third embodiment.

A sputtering apparatus according to the third embodiment will be described with reference to FIGS. 10 and 11. FIG. 10 is a schematic sectional view schematically showing the sputtering apparatus according to the third embodiment. FIG. 10 shows a section taken along the line i-i in FIG. 11. FIG. 11 is a plan view schematically showing the layout relationship between a substrate holder and a cathode unit. Note that the same reference numerals as those in FIG. 1 of the first embodiment denote the same parts.

As shown in FIG. 10, a chamber 10 of a sputtering apparatus 1 according to the third embodiment has a gas inlet 12. A reactive gas introduction system 13 is connected to the gas inlet 12 to introduce a reactive process gas (reactive gas) into the chamber 10. The reactive gas introduction system 13 is connected to a gas cylinder (not shown) via an automatic flow controller (not shown) such as a massflow controller. A reactive gas is introduced via the gas inlet 12 at a predetermined flow rate. When performing reactive sputtering in the chamber 10, the reactive gas introduction system 13 supplies a reactive gas into the chamber 10.

A plurality of cathode units 40 each including a cathode which holds a target are arranged diagonally above a substrate holder 22 in the processing space. That is, a plurality of cathode units 40 are arranged for one substrate holder 22. Each cathode unit 40 is inclined and attached to the top wall of the chamber 10.

In the embodiment, five cathode units 40, that is, 40a to 40e are attached to the top wall of the chamber 10. However, the number of cathode units 40 is not limited to this. The cathode units 40 are arranged offset at positions diagonally opposing the substrate 21 so that they are inclined with respect to the processing surface of a substrate 21 on the substrate holder 22 and are deviated at equal intervals from the central axis of the substrate 21 in directions extended from the processing surface. More specifically, the center axes of the cathodes of the cathode units 40 are positioned off the axis of rotation of the substrate holder 22, and arranged at equal intervals on a concentric circle at a predetermined distance from the axis of rotation. Since the single chamber 10 stores a plurality of cathode units 40, a multilayered structure (stack) can be deposited in one chamber 10.

Note that the diameter of the substrate 21 and that of the target are not particularly limited. However, when the center of the substrate 21 and that of the cathode are arranged offset and the substrate 21 is rotated as in the embodiment, uniform film deposition is possible even if the diameter of the target is smaller than that of the substrate 21. In the embodiment, the five cathode units 40 are arranged, so, for example, five types of targets made of different material components can be attached. However, the present invention is not limited to this.

Similar to FIG. 1, each cathode unit 40 is electrically connected to a discharge power supply (not shown) which applies a discharge voltage to the cathode. The discharge power is an arbitrary one of high-frequency power, DC power, and superposition of high-frequency power and DC power. The discharge voltage is selectively applied to a plurality of cathode units 40. However, an individual discharge power supply may be connected to each cathode unit 40. Alternatively, a switching mechanism such as a switch may be adopted to selectively supply power from a common power supply.

A shutter 45 is arranged in front of the cathode units 40 to selectively close the space between some cathodes and the substrate holder 22. By selectively opening the shutter 45, a desired target can be selected from those of the cathode units 40 to execute sputtering. The shutter 45 can prevent contamination from other sputtered targets.

Figure 12:
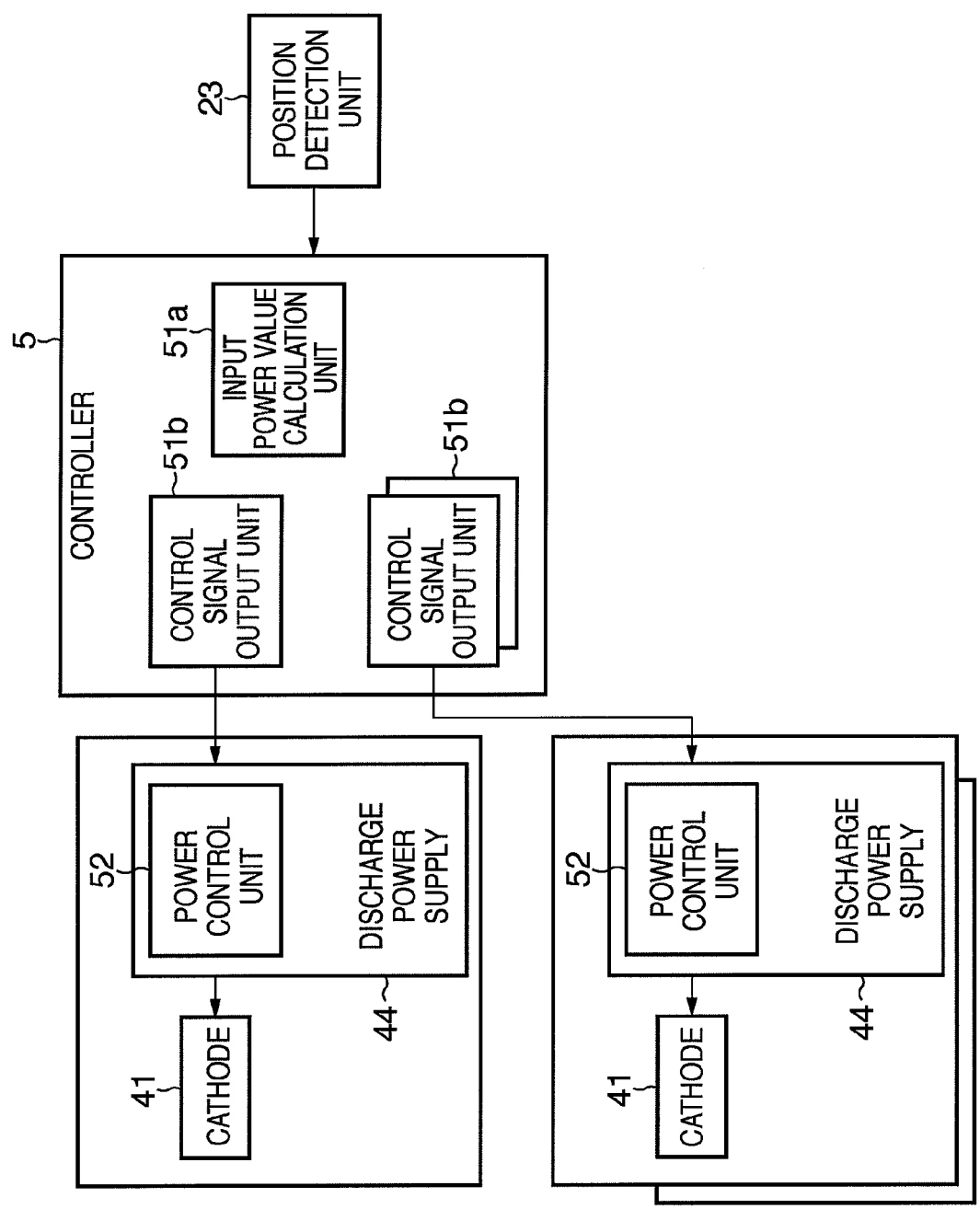
FIG. 12 is a block diagram showing the arrangements of a cathode unit and controller according to the third embodiment.

A controller 5 and the cathode units 40 which are mounted in the sputtering apparatus of the embodiment will now be explained with reference to FIG. 12. FIG. 12 is a block diagram showing the arrangements of the controller 5 and cathode units 40 according to the embodiment.

Similar to FIG. 3, the controller 5 shown in FIG. 12 includes an input power value calculation unit 51a and control signal output units 51b. The input power value calculation unit 51a calculates input power to each of cathodes 41 to increase/decrease the film deposition amount in accordance with a rotational position detected by a position detection unit 23. The control signal output units 51b are arranged in correspondence with the respective cathodes 41, and output a control signal (e.g., voltage or current corresponding to a power value having a calculated magnitude) to adjust the power value to the calculated one.

A power control unit 52 of each cathode unit 40 increases/decreases power from a discharge power supply 44 based on a control signal input from the control signal output unit 51b, and outputs, to the cathode 41, power having a magnitude calculated by the input power value calculation unit 51a. The cathode 41 receives discharge power corresponding to the rotational position of the substrate 21. The input power value is given by, for example, a sine wave function with respect to the rotational position of the substrate 21, as shown in FIG. 4. The input power value calculation unit 51a can calculate an input power value by defining in advance, as a map as shown in FIG. 4, the correspondence between the rotational position of the substrate 21 and input power to the cathode 41.

A sputtering method executed using the sputtering apparatus in the third embodiment is the same as that in the first embodiment except for the following point. That is, magnetic fields are formed on the surfaces of the targets 42 in the cathode units 40. Discharge power is supplied to generate plasma discharges between the targets 42 and the substrate holder 22, thereby co-sputtering a plurality of targets. The operation of the sputtering apparatus in the third embodiment is also the same as that described in the first embodiment (FIGS. 5, 6A and 6B).

More specifically, $\theta$ is an angle formed by a specific position of the substrate and the installation position of each cathode 41 with respect to the center of rotation. The input power value calculation unit 51a of the controller 5 calculates the angle $\theta$ for each cathode 41, and calculates the value of input power to each cathode by applying the foregoing equations (1) and (2).

As described above with reference to FIG. 5, a magnetic field formed by a substrate-side magnet 30 rotates in synchronism with the substrate. Even if the substrate is rotated, the nonuniformity of the scattering amount of sputtered particles cannot be canceled, resulting in the nonuniformity of the final film thickness distribution. When co-sputtering is performed, like the third embodiment, the film thickness itself may be averaged depending on the positional relationship between the cathodes 41 which simultaneously discharge. However, as for the film composition, each target material still suffers a nonuniform distribution as described above. To solve this, the embodiment uniforms the film deposition distribution for each cathode 41 and each target 42. Even in co-sputtering, the distribution of each target material becomes uniform, and film deposition with a uniform composition can be achieved. Also in the third embodiment, the control pattern may be changed in accordance with the target material, as described with reference to FIGS. 7 to 9. This is because the trend of nonuniformity of the film thickness distribution changes depending on the target material.

[Fourth Embodiment]

Figures 13, 14:
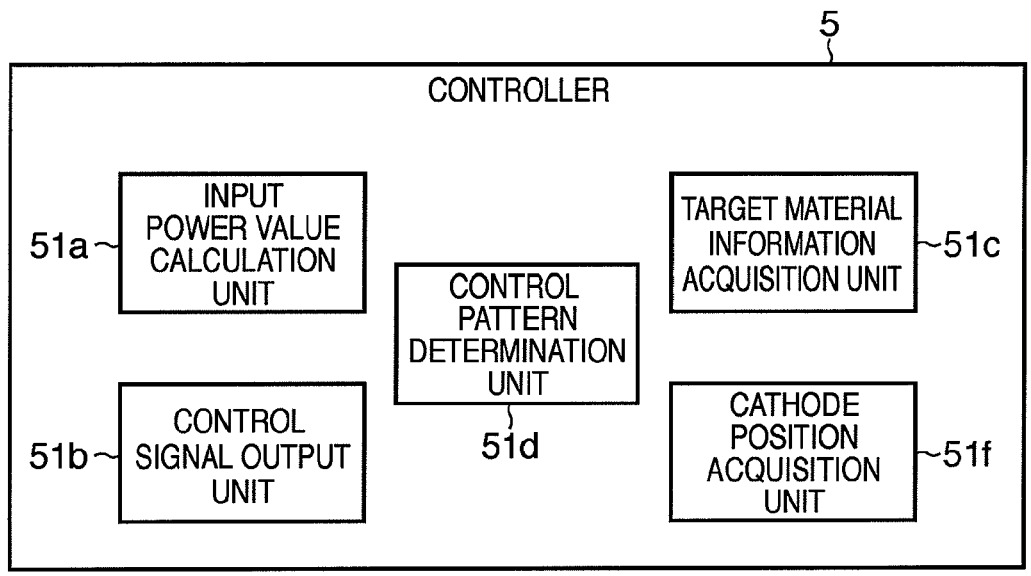
FIG. 13 is a block diagram showing the arrangement of a controller according to the fourth embodiment.
FIG. 14 is a table exemplifying a table which defines the correspondence between the cathode position and the control pattern.

The control pattern may be changed in accordance with the positional relationship between cathodes which simultaneously discharge, as shown in FIGS. 13 and 14. This is because the trend of nonuniformity of the film thickness distribution changes depending on the interferences of an electric field and electromagnetic field formed by other cathodes. FIG. 13 is a block diagram showing the arrangement of a controller 5. The remaining arrangement is the same as that in FIG. 3 in the first embodiment. A target material information acquisition unit 51c acquires information of a target material selected in film deposition as a user input, data stored in advance, or the like. Based on a combination of cathodes 41 which simultaneously discharge, a cathode position acquisition unit 51f acquires the positional relationship between the cathodes 41. A control pattern determination unit 51d holds a table as shown in FIG. 8. By using, for example, a table as shown in FIG. 14, the control pattern determination unit 51d determines a control pattern based on target material information acquired by the target material information acquisition unit 51c, and the cathode positional relationship acquired by the cathode position acquisition unit 51f.

FIG. 14 exemplifies determination of the control pattern. In the example of FIG. 14, when performing co-sputtering at adjacent cathodes using target material 1 in the sputtering apparatus shown in FIG. 10 (second line, "combination of cathode positions"=72°), A, B, and α in the above-described equation (1) are set to predetermined values A1, B1, and α1. With this setting, a film with a more uniform composition can be deposited.

[Fifth Embodiment]

The present invention is also applicable to high-frequency sputtering using a high-frequency power supply. More specifically, high-frequency power is controlled to increase/decrease the sputtering yield in accordance with the rotational position of the substrate. Also in this case, the film thickness distribution can be uniformed.

For example, the amplitude of high-frequency power serving as a base is changed in accordance with the rotational position of the substrate. The magnitude of average power per high-frequency cycle (or the magnitude of average power when the substrate falls within a predetermined rotational section) is increased/decreased. As a result, the sputtering yield can be adjusted in accordance with the rotational position of the substrate.

Figure 15:
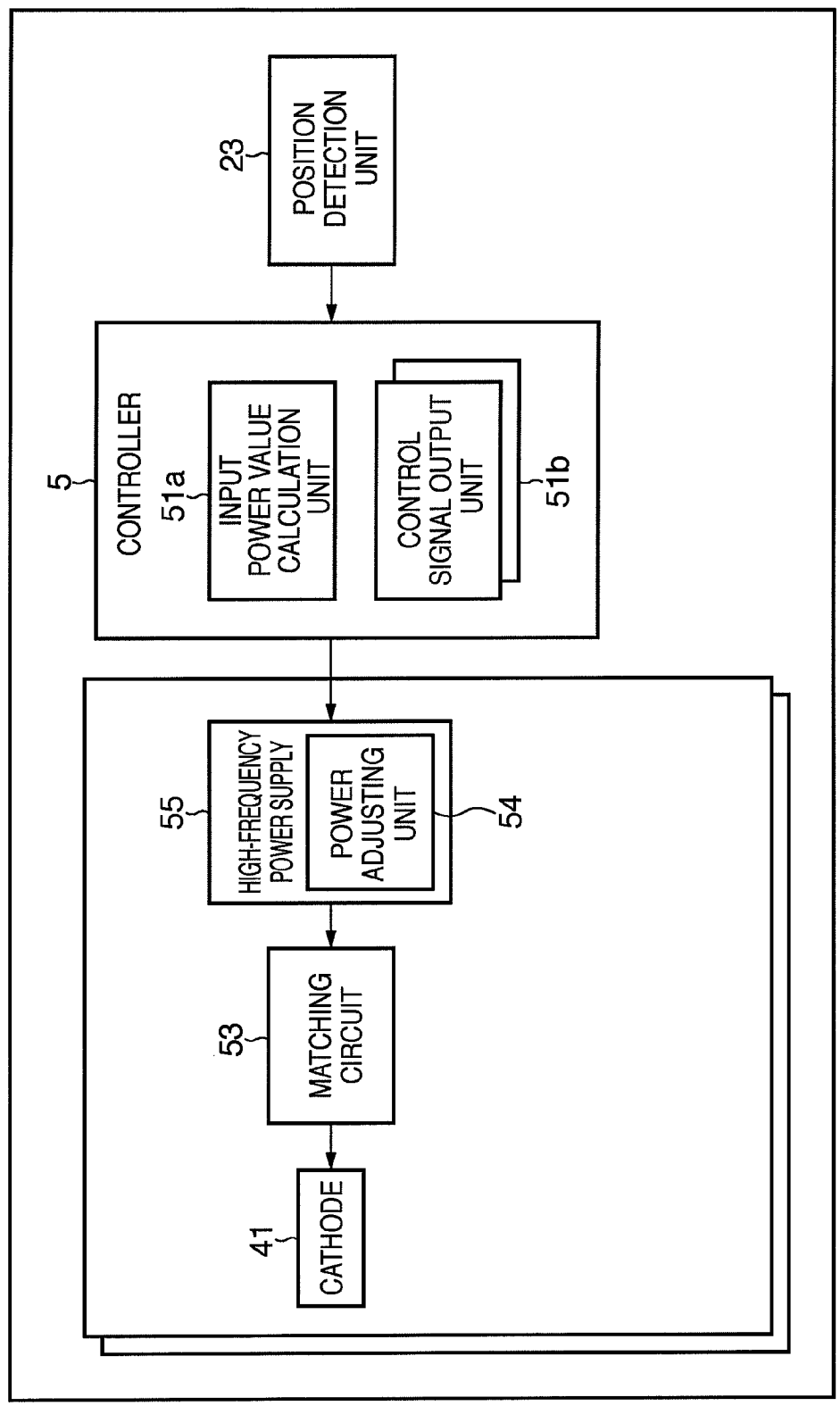
FIG. 15 is a block diagram showing the arrangement of a sputtering apparatus according to the fifth embodiment.

In the example of FIG. 15, a high-frequency power supply (e.g., 1 MHz to 300 MHz) is used. A control signal output unit 51b outputs a control signal to a high-frequency power supply 55. The high-frequency power supply 55 can supply, to a cathode 41 via a matching circuit 53, high-frequency power which is adjusted via a power adjusting unit 54. The control signal is obtained by a sine wave function of the amplitude with respect to the rotational position of the substrate. The cathode receives high-frequency power which is increased/decreased in accordance with the rotational position of the cathode.

[Other Embodiments]

The present invention can be variously modified without departing from the scope of the invention.

For example, the central axis of the cathode 41 (target 42) in FIG. 1 is parallel to that of the substrate 21 (substrate holder 22). However, the central axis of the cathode 41 may be inclined in a direction in which the surface of the cathode 41 faces the substrate 21. The difference in film thickness between the first and second portions can also be canceled by increasing the rotational speed of the substrate 21 when the first portion moves on the side of the cathode 41, and decreasing it when the second portion moves on the side of the cathode 41. Generation of the film thickness distribution can also be suppressed by controlling both discharge power and the rotational speed of the substrate 21. For example, both discharge power and the rotational speed of the substrate 21 can be controlled by sine wave control.

Figure 16:
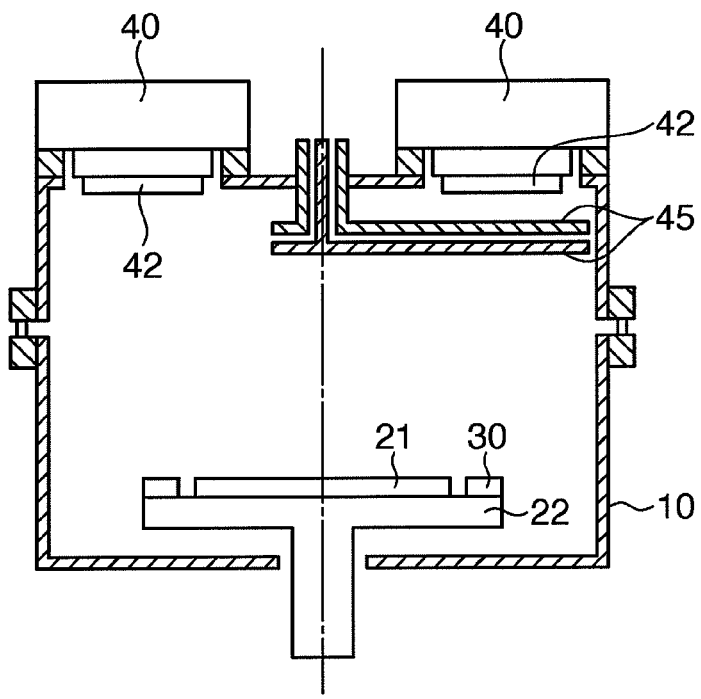
FIG. 16 exemplifies another arrangement of the sputtering apparatus.

In FIG. 10, the cathode 41 is inclined with respect to the substrate holder 22. Instead, the central axis of the cathode 41 (target 42) may be arranged parallel to that of the substrate 21 (substrate holder 22), as shown in FIG. 16.

[Example of Manufacturable Electronic Component]

FIG. 17 is an explanatory view showing a TMR element as an example of an electronic component which can be formed by applying the sputtering method using the sputtering apparatus according to the present invention. The TMR element is a magnetic effect element (TMR (Tunneling Magneto Resistance) element).

As shown in FIG. 17, the basic layer structure of a TMR element 110 includes an magnetic tunnel junction portion (MTJ portion) formed from a second magnetization pinned layer 107, tunnel barrier layer 108, and magnetization free layer 109. For example, the second magnetization pinned layer 107 is made of a ferromagnetic material, the tunnel barrier layer 108 is made of a metal oxide (e.g., magnesium oxide or alumina) insulating material, and the magnetization free layer 109 is made of a ferromagnetic material.

In the TMR element 110, a predetermined voltage is applied to the ferromagnetic layers on the two sides of the tunnel barrier layer 108, supplying a predetermined current. In this state, an external magnetic field is applied. At this time, when the directions of magnetization in the ferromagnetic layers are parallel and coincident (called "parallel state"), the electrical resistance of the TMR element becomes minimum. When the directions of magnetization in the ferromagnetic layers are parallel and opposite (called "antiparallel state"), the electrical resistance of the TMR element 110 becomes maximum. The magnetization of the second magnetization pinned layer 107 out of the ferromagnetic layers on the two sides is pinned. In contrast, the direction of magnetization in the magnetization free layer 109 can be reversed by applying an external magnetic field for write.

In the film deposition step of the second magnetization pinned layer 107, sputtering film deposition is performed using the substrate-side magnet 30 to magnetize the second magnetization pinned layer 107 in a predetermined direction. During the film deposition, input power is controlled to form a sine wave in accordance with the rotational position of the substrate. As a result, the second magnetization pinned layer 107 having a uniform sheet resistance distribution can be formed.

Note that the second magnetization pinned layer 107 can be made of a material which contains a ferromagnetic material such as Co, Fe, or Ni as a main component, to which a material such as B is properly added. Also in film deposition of the first magnetization pinned layer, magnetization free layer 109, and the like, in addition to the second magnetization pinned layer 107, they are magnetized in a predetermined direction using the substrate-side magnet 30. Also in this case, the present invention can be applied to form films each exhibiting a uniform sheet resistance distribution.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A sputtering apparatus comprising:
    a substrate holder which holds a substrate to be rotatable in a plane direction of a processing surface of the substrate;
    substrate magnetic field forming means, arranged around the substrate, for forming a magnetic field on the processing surface of the substrate;
    a cathode which is arranged at a position diagonally opposing the substrate and receives discharge power;
    position detection means for detecting a rotational position of the substrate; and
    power control means for controlling power applied to said cathode in accordance with the rotational position detected by said position detection means,
    wherein said power control means applies first power when a first portion where a scattering amount of sputtered particles is large due to a formation state of a magnetic field on the substrate is positioned near said cathode, and applies second power higher than the first power when a second positioned where the scattering amount of sputtered particles is smaller than the scattering amount of sputtered particles at the first portion is positioned near said cathode.

2. The sputtering apparatus according to claim 1, wherein said substrate magnetic field forming means is rotatable in synchronism with the substrate, and forms a magnetic field having a directional property along the processing surface of the substrate.

3. The sputtering apparatus according to claim 1, wherein said power control means gradually decreases input power to the first power as the first portion comes close to said cathode, and gradually increases the input power to the second power as the second portion comes close to said cathode.

4. The sputtering apparatus according to claim 1, wherein said power control means controls the power applied to said cathode so as to obtain a power value as a sine wave function with respect to an angle of rotation of the substrate.

5. The sputtering apparatus according to claim 1, further comprising:
    a plurality of cathodes which are arranged at positions diagonally opposing the substrate and receive discharge power, respectively;
    a plurality of power control means, arranged in correspondence with said respective cathodes, each for controlling power applied to said corresponding cathode in accordance with the rotational position detected by said position detection means; and
    film deposition control means for executing film deposition by co-sputtering for the substrate held by said substrate holder by applying discharge power to said plurality of cathodes via said plurality of power control means.

6. The sputtering apparatus according to claim 5, wherein each power control means of said plurality of power control means gradually decreases input power to the first power as the first portion comes close to said corresponding cathode, and gradually increases the input power to the second power as the second portion comes close to said corresponding cathode.

7. The sputtering apparatus according to claim 5, wherein each power control means of said plurality of power control means controls the power applied to said corresponding cathode so as to obtain a power value as a sine wave function with respect to an angle of rotation of the substrate.

8. The sputtering apparatus according to claim 5, wherein each power control means of said plurality of power control means adjusts the power applied to said corresponding cathode, based on a control pattern set in accordance with a target material to be sputtered.

9. The sputtering apparatus according to claim 5, wherein each power control means of said plurality of power control means adjusts the power applied to said corresponding cathode, based on a control pattern set in accordance with a positional relationship between said corresponding cathode and said remaining cathodes.

10. A sputtering method comprising executing film deposition by applying, to a cathode arranged at a position diagonally opposing a substrate, power adjusted in accordance with a rotational position of the substrate that is detected by position detection means, while rotating the substrate in a plane direction of a processing surface of the substrate and forming a magnetic field on the processing surface,
    wherein executing film deposition includes applying first power when a first portion where a scattering amount of sputtered particles is large due to a formation state of a magnetic field on the substrate is positioned near said cathode, and applying second power higher than the first power when a second portion where the scattering amount of sputtered particles is smaller than the scattering amount of sputtered particles at the first portion is positioned near said cathode.

11. The sputtering method according to claim 10, wherein a magnetic film is deposited.

12. An electronic device manufacturing method comprising a film deposition step comprising:
    depositing a film by a sputtering method by applying, to a cathode arranged at a position diagonally opposing a substrate, power adjusted in accordance with a rotational position of the substrate that is detected by position detection means, while rotating the substrate in a plane direction of a processing surface of the substrate and forming a magnetic field on the processing surface;
    applying first power when a first portion where a scattering amount of sputtered particles is large due to a formation state of a magnetic field on the substrate is positioned near said cathode; and
    applying second power higher than the first power when a second portion where the scattering amount of sputtered particles is smaller than the scattering amount of sputtered particles at the first portion is positioned near said cathode.

13. A sputtering method comprising executing film deposition by co-sputtering by applying, to a plurality of cathodes which are arranged at positions diagonally opposing a substrate and hold targets formed from different materials, power adjusted in accordance with a rotational position of the substrate that is detected by position detection means, while rotating the substrate in a plane direction of a processing surface of the substrate and forming a magnetic field on the processing surface, wherein executing film deposition includes applying first power when a first portion where a scattering amount of sputtered particles is large due to a formation state of a magnetic field on the substrate is positioned near said cathode, and applying second power higher than the first power when a second portion where the scattering amount of sputtered particles is smaller than the scattering amount of sputtered particles at the first portion is positioned near said cathode.

14. The sputtering method according to claim 13, wherein a magnetic film is deposited.

15. An electronic device manufacturing method comprising a film deposition step of executing film deposition by co-sputtering comprising:

applying, to a plurality of cathodes which are arranged at positions diagonally opposing a substrate and hold targets formed from different materials, power adjusted in accordance with a rotational position of the substrate that is detected by position detection means, while rotating the substrate in a plane direction of a processing surface of the substrate and forming a magnetic field on the processing surface;

applying first power when a first portion where a scattering amount of sputtered particles is large due to a formation state of a magnetic field on the substrate is positioned near said cathode; and applying second power higher than the first power when a second portion where the scattering amount of sputtered particles is smaller than the scattering amount of sputtered particles at the first portion is positioned near said cathode.

\* \* \* \* \*